(12) United States Patent
Hughes

(10) Patent No.: US 6,853,272 B1
(45) Date of Patent: Feb. 8, 2005

(54) LINEAR VOLTAGE CONTROLLED CAPACITANCE CIRCUIT

(75) Inventor: Rodney Alan Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 260 days.

(21) Appl. No.: 10/295,221

(22) Filed: Nov. 15, 2002

(51) Int. Cl.[7] .............................. H03J 5/12; H01P 1/15
(52) U.S. Cl. ........................................ 334/15; 333/103
(58) Field of Search ........................... 334/15; 333/103, 333/164, 262

(56) References Cited

U.S. PATENT DOCUMENTS

| | | | | |
|---|---|---|---|---|
| 3,295,138 A | * | 12/1966 | Nelson | 342/375 |
| 5,034,708 A | * | 7/1991 | Adamian et al. | 333/161 |
| 5,561,398 A | * | 10/1996 | Rasmussen | 331/36 C |
| 6,724,273 B1 | * | 4/2004 | Jones | 331/177 V |

* cited by examiner

*Primary Examiner*—Robert Pascal
*Assistant Examiner*—Dean Takaoka

(57) ABSTRACT

A linear voltage controlled capacitance circuit is provided that includes a plurality of MOS varactor pairs. Each MOS varactor pair is operable to receive a first tuning voltage, a second tuning voltage, and a bias voltage unique to the MOS varactor pair. The capacitance circuit is operable to generate a positive tank node signal and a negative tank node signal based on the first and second tuning voltages and the bias voltages. A means to control voltage-to-capacitance gain is also provided to compensate for coarse tuning capacitance change.

24 Claims, 3 Drawing Sheets

LINEAR VOLTAGE CONTROLLED CAPACITANCE CIRCUIT

TECHNICAL FIELD OF THE INVENTION

The present invention relates generally to resonant LC tank circuits employed in programmable tuned circuit applications and, more particularly, to a linear voltage controlled capacitance circuit with fine tuning gain compensation.

BACKGROUND OF THE INVENTION

Voltage controlled capacitance elements, or varactors, are useful in oscillator circuits that are commonly used in communication devices, as well as in many other applications. Resonant tank circuits are often used for radio frequency oscillator circuits because of their high-resonance frequency of operation, low phase and amplitude noise, and low power consumption. In order to tune such a circuit, capacitance is typically controlled by an external circuit to vary the frequency of resonance. A large capacitance control variance range is often necessary to compensate for manufacturing variances of the individual components, as well as to provide a means to cover a wide tuning frequency range in many applications. This is often accomplished by means of coarse tuning 'switched' capacitors applied to the tank circuit and a fine tuning voltage controlled capacitance, or varactor, generally driven by an analog control feedback loop such as a phase locked loop system.

In such a control feedback system, it is desirable to control the voltage-to-frequency gain constant across the tuning range. This implies that the voltage-to-capacitance transfer function be linear. This also requires that that the fine tune capacitance range be a constant percentage of the total tank capacitance. The fine tuning capacitance range must increase when switching more coarse tuning capacitance onto the tank circuit. In voltage controlled oscillators, this gain factor is referred to as Kvco or the gain of the voltage controlled oscillator.

With regard to the varactor element of the oscillator circuit, the two primary factors that contribute to phase noise are (i) the quality factor, Q, of the varactor element and (ii) the non-linear varactor capacitance versus voltage transfer characteristics that cause excessively high voltage controlled oscillator gain.

One type of varactor element, the metal-oxide-semiconductor (MOS) varactor element, has been shown to have advantageous quality factor characteristics over the more common junction varactor elements. However, the strongly non-linear capacitance-voltage (CV) transfer characteristic, coupled with a very limited tuning range, has limited the usefulness of MOS varactor elements. In addition, some MOS varactor elements have a non-monotonic CV transfer characteristic just outside the upper end of their limited tuning range.

SUMMARY OF THE INVENTION

In accordance with the present invention, a linear voltage controlled capacitance circuit with a controlled gain constant is provided that substantially eliminate or reduce disadvantages and problems associated with conventional systems. In particular, MOS varactor elements are used in the voltage controlled capacitance circuit in such a way as to provide a linear, wide tuning voltage range, while presenting a high Q capacitance to the differential tank circuit in which it is implemented.

According to one embodiment of the present invention, a linear voltage controlled capacitance circuit is provided that includes a plurality of MOS varactor pairs. Each MOS varactor pair is operable to receive a first tuning voltage, a second tuning voltage, and a bias voltage unique to the MOS varactor pair. The capacitance circuit is operable to generate a positive tank node signal and a negative tank node signal based on the first and second tuning voltages and the bias voltages.

According to another embodiment of the present invention, a linear voltage controlled capacitance circuit is provided that includes a first set of MOS varactor pairs, a set of first resistors, a second resistor, a positive tank node and a negative tank node. Each MOS varactor pair comprises a first varactor device and a second varactor device, with each varactor device having a well connection and also having a gate. The gates of the first varactor devices are operable to receive a first tuning voltage and the gates of the second varactor devices are operable to receive a second tuning voltage. The set of first resistors is coupled in series. The well connections of the varactor devices in each MOS varactor pair are coupled to a corresponding one of the first resistors. The second resistor is coupled in series with the set of first resistors and is operable to receive a bias voltage. The positive tank node is coupled to the gate of the first varactor device in a specified MOS varactor pair and is operable to generate a positive tank node signal. The negative tank node is coupled to the gate of the second varactor device in the specified MOS varactor pair and is operable to generate a negative tank node signal.

According to yet another embodiment of the present invention, a tank circuit is provided that includes a first inductor, a second inductor, a plurality of first, second, third and fourth capacitors, a plurality of switches, and a linear voltage controlled capacitance circuit. The first capacitors are coupled to the first inductor and in parallel with each other. Each of the second capacitors is coupled to a corresponding one of the first capacitors. The third capacitors are coupled to the second inductor and in parallel with each other. Each of the fourth capacitors is coupled to a corresponding one of the third capacitors. Each switch is coupled between one of the first capacitors and a corresponding second capacitor and between one of the third capacitors and a corresponding fourth capacitor. The capacitance circuit is coupled to the first and second inductors and to the plurality of first and third capacitors. The capacitance circuit includes a plurality of MOS varactor pairs. Each MOS varactor pair is operable to receive a first tuning voltage, a second tuning voltage, and a bias voltage unique to the MOS varactor pair. The capacitance circuit is operable to generate a positive tank node signal and a negative tank node signal based on the first and second tuning voltages and the bias voltages.

According to still another embodiment of the present invention, a tank circuit is provided that includes a first inductor, a second inductor, a plurality of coarse and fine tune capacitors, a plurality of coarse tune switches, and a linear voltage controlled capacitance circuit. The first coarse tune capacitors are coupled to the first inductor and in parallel with each other. The second coarse tune capacitors are coupled to the second inductor and in parallel with each other. The first tine tune capacitors are coupled to the first inductor and in parallel with each other. The second fine tune capacitors are coupled to the second inductor and in parallel with each other. Each coarse tune switch is coupled between one of the first coarse tune capacitors and a corresponding second coarse tune capacitor. The capacitance circuit is coupled to the first inductor through the first fine tune capacitors and is coupled to the second inductor through the second fine tune capacitors. The capacitance circuit is operable to receive a plurality of tuning nodes. The tank circuit is operable to generate a positive tank node signal and a negative tank node signal based on the tuning nodes. Technical advantages of one or more embodiments of the present invention include providing an improved voltage controlled capacitance circuit. In a particular embodiment, a tank circuit includes a multi-stage MOS varactor linearization circuit, which uses several MOS varactors, differentially coupled, with varying DC bias voltage points. As a result, the capacitance provided to the tank circuit has a linear voltage controlled characteristic. In addition, this results in a wide coarse tuning range and more accurate control loop bandwidth.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
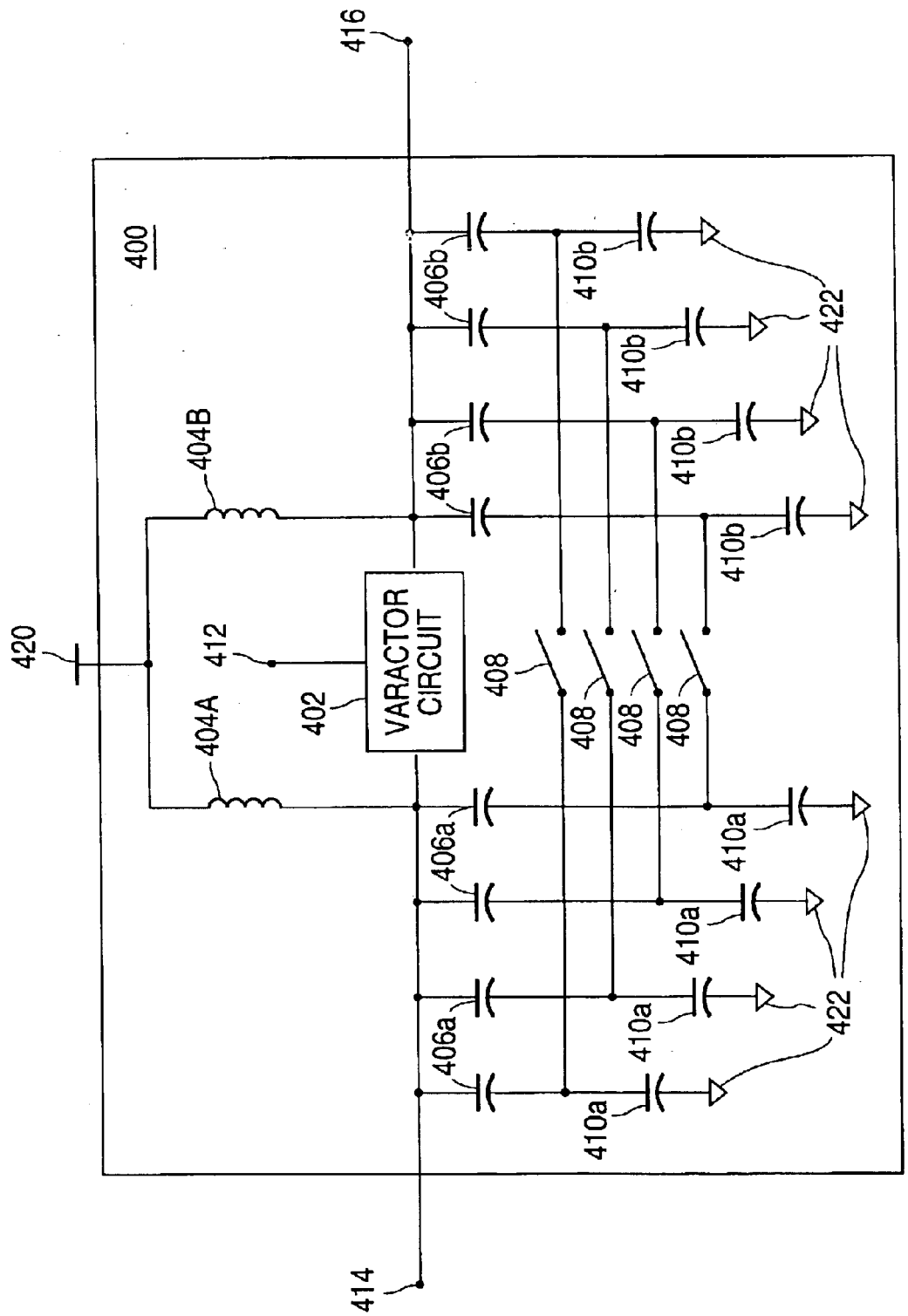
FIG. 1 is a block diagram illustrating a tank circuit in accordance with one embodiment of the present invention.
Figure 2:
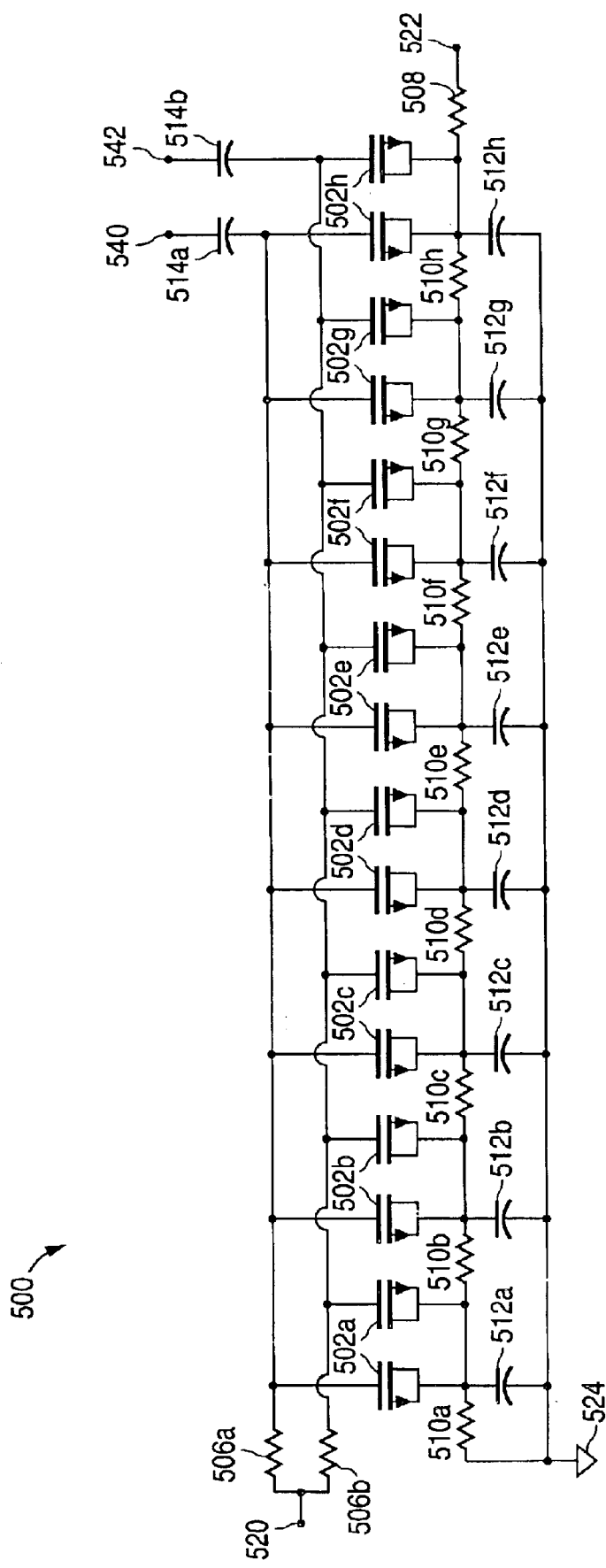
FIG. 2 is a block diagram illustrating the linear voltage controlled capacitance circuit of FIG. 1 in accordance with one embodiment of the present invention.
Figure 3:
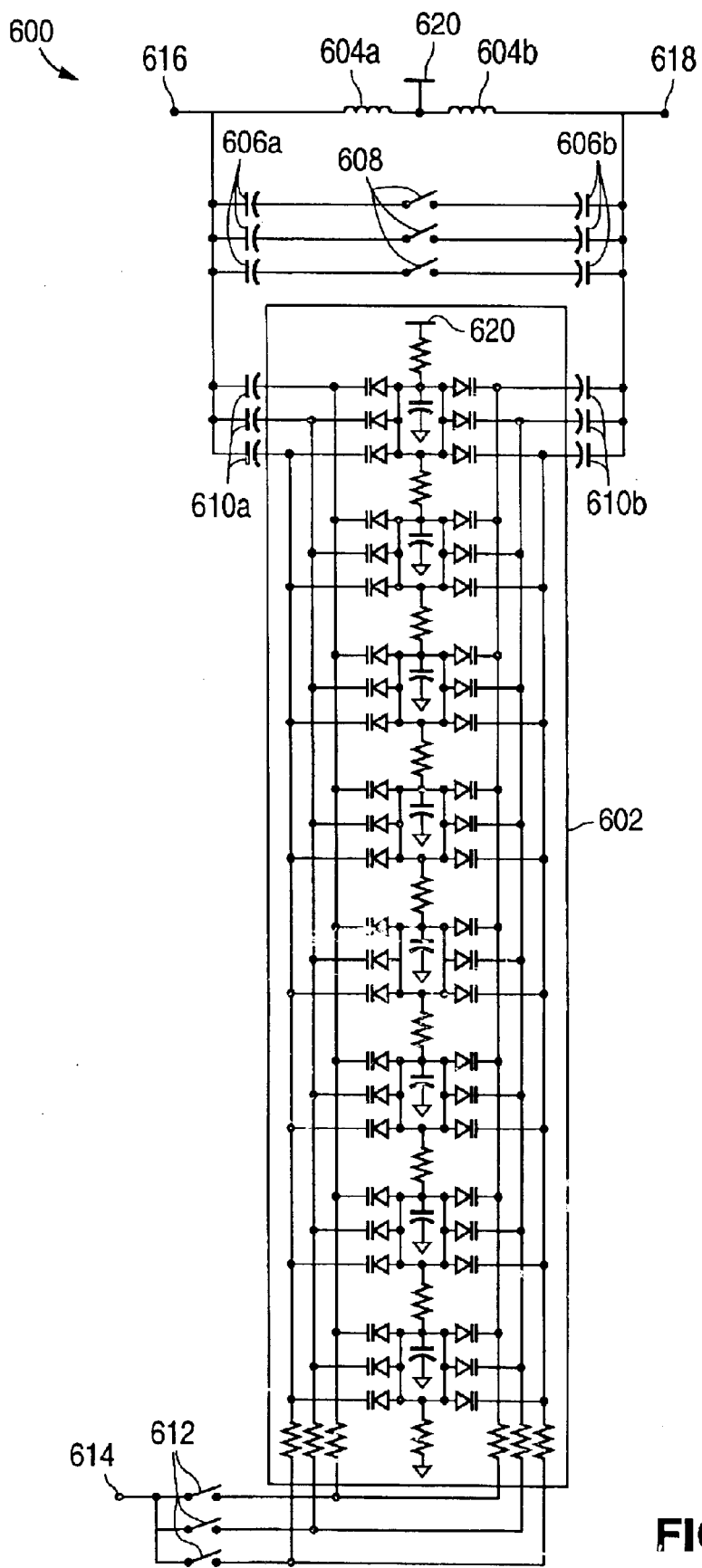
FIG. 3 is a block diagram illustrating a tank circuit in accordance with a second embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged tank circuit.

FIG. 1 is a block diagram illustrating a tank circuit 400 in accordance with one embodiment of the present invention. The tank circuit 400 may be implemented in a voltage controlled oscillator, a resonant filter, or any other suitable device. The tank circuit 400 comprises a varactor circuit 402, a plurality of inductors 404, a plurality of capacitors 406 and 410, and a plurality of switches 408.

Although the illustrated tank circuit 400 comprises eight capacitors 406 and 410 and four switches 408, it will be understood that the tank circuit 400 may comprise any suitable number of capacitors 406 and 410 and switches 408 without departing from the scope of the present invention. According to one embodiment, the switches 408 comprise MOS switches.

The tank circuit 400 is operable to receive a voltage control signal from a voltage control node 412 and, based on the voltage control signal, to generate a positive tank node signal at a positive tank node 414 and a negative tank node signal at a negative tank node 416. According to an embodiment in which the tank circuit 400 is implemented in a voltage controlled oscillator of a frequency synthesizer, the voltage control signal may correspond to a loop filter output signal. The varactor circuit 402 is coupled to the voltage control node 412, the positive tank node 414 and the negative tank node 416.

For the illustrated embodiment, a first inductor 404a is coupled to a power supply 420 and to the positive tank node 414, and a second inductor 404b is coupled to the power supply 420 and to the negative tank node 416. In addition, each of a first set of capacitors 406a is coupled to the positive tank node 414 and to a corresponding capacitor 410a in a second set of capacitors 410a. Each of the pairs of capacitors 406a and 410a is also coupled to a switch 408, and the second set of capacitors 410a is coupled to ground 422. As used herein, "each" means every one of at least a subset of the identified items.

Each of a third set of capacitors 406b is coupled to the negative tank node 416 and to a corresponding capacitor 410b in a fourth set of capacitors 410b. Each of the pairs of capacitors 406b and 410b is also coupled to a switch 408 that is coupled to a pair of capacitors 406a and 410a, and the fourth set of capacitors 410b is coupled to ground 422.

The varactor circuit 402 comprises a linear voltage controlled capacitance circuit, as described in more detail below in connection with FIG. 2. It will be understood that the inductors 404 may provide any suit able amount of inductance and the capacitors 406 and 410 may provide any suitable amount of capacitance without departing from the scope of the present invention.

The switches 408 may be controlled by a control system (not shown in FIG. 1) that is operable to measure frequency output and to determine whether to close additional switches 408 to add capacitors 410 in order to lower the frequency or to open additional switches 408 to remove capacitors 410 in order to raise the frequency.

FIG. 2 is a block diagram illustrating a linear voltage controlled capacitance circuit 500 in accordance with one embodiment of the present invention. The linear voltage controlled capacitance circuit 500 may be used as the varactor circuit 402. However, it will be understood that the linear voltage controlled capacitance circuit 500 may be used as a varactor circuit in any suitable tank circuit other than the tank circuit 400 without departing from the scope of the present invention.

The linear voltage controlled capacitance circuit 500 comprises a set of MOS varactor pairs 502, a plurality of resistors 506, 508 and 510, and a plurality of capacitors 512 and 514. For the illustrated embodiment, each MOS varactor pair 502 comprises both a first and second n-type MOS varactor device. However, it will be understood that each MOS varactor pair 502 may comprise a first and second p-type MOS varactor device without departing from the scope of the present invention.

Each of the MOS varactor devices has a well connection which forms a voltage-controlled capacitive element to the gate connection. The capacitances of these MOS varactor pairs 502 are dependent on the voltages between the gates and the well connections of the MOS varactor devices.

In operation, a tuning voltage at a voltage-controlled tuning node 520 is applied to the resistors 506 before being passed to the gates of the varactor devices of the MOS varactor pairs 502. According to the embodiment in which the tank circuit is implemented in a voltage controlled oscillator of a frequency synthesizer, the tuning voltage may correspond to a loop filter output signal during normal operation.

According to the illustrated embodiment, the tuning voltage is applied to the resistor 506a and then passed to the first varactor devices of the MOS varactor pairs 502. Similarly, the tuning voltage is applied to the resistor 506b and then passed to the second varactor devices of the MOS varactor pairs 502.

A bias voltage at a bias voltage node 522 is applied to the resistor 508 before being passed to the well connections of the varactor devices of the MOS varactor pairs 502 through the resistors 510. The bias voltage comprises a constant, regulated DC voltage. The well connection of each varactor device in the set of MOS varactor pairs 502 is coupled to a corresponding resistor 510, with the set of resistors 510 being coupled in series to each other, to the resistor 508 and to the bias voltage node 522. Thus, each MOS varactor pair 502 receives a different DC bias voltage due to the voltage division created by the resistors 508 and 510.

In addition to the resistors 510, the well connection of each varactor device in the set of MOS varactor pairs 502 is coupled to a corresponding capacitor 512 that is also coupled to ground 524, which provides a filter for each MOS varactor pair 502. The first resistor 510a that is coupled to the first MOS varactor pair 502a is also coupled to ground 524.

The tuning switches 408 of FIG. 1 may be used to provide coarse tuning of the output frequency for the tank circuit, and the tuning voltage may be used to provide fine tuning of the output frequency. Thus, during tuning, the tuning voltage may be set to a mid-range voltage, and the coarse tuning may be performed using the switches 408 as described above. For the embodiment in which the tank circuit is implemented in a voltage controlled oscillator of a frequency synthesizer, the voltage-controlled tuning node 520 may then be re-coupled to a loop filter of a frequency synthesizer in order to lock the appropriate frequency.

The linear voltage controlled capacitance circuit 500 is operable to generate a positive tank node signal at a positive tank node 540 and a negative tank node signal at a negative tank node 542. The positive tank node 540 is coupled to the gate of the first varactor device in the final MOS varactor pair 502h through the capacitor 514a, and the negative tank node 542 is coupled to the gate of the second varactor device in the final MOS varactor pair 502h through the capacitor 514b.

Each varactor device in a particular MOS varactor pair 502 is substantially matched such that any AC current flowing through the resistors 508 and 510 and the capacitors 512 is minimized. In addition, the DC bias points are selected such that the combined equivalent differential capacitance seen across the positive and negative tank nodes 540 and 542 has a linear voltage variable characteristic with the tuning voltage. The capacitors 514 will also have some voltage-dependent capacitance characteristic that may be corrected by appropriate selection of the DC bias points. It will be understood that the resistors 506, 508 and 510 may provide any suitable amount of resistance and the capacitors 512 and 514 may provide any suitable amount of capacitance without departing from the scope of the present invention.

FIG. 3 is a block diagram illustrating a tank circuit 600 in accordance with one embodiment of the present invention. The tank circuit 600 may be implemented in a voltage controlled oscillator, a resonant filter, or any other suitable device. The tank circuit 600 comprises a varactor circuit 602, a plurality of inductors 604, a plurality of coarse tune capacitors 606 and fine tune capacitors 610, and a plurality of coarse tune switches 608 and gain control switches 612.

Although the illustrated tank circuit 600 comprises six capacitors 606 and 610 and three switches 608 and 612, it will be understood that the tank circuit 600 may comprise any suitable number of capacitors 606 and 610 and switches 608 and 612 without departing from the scope of the present invention.

The tank circuit 600 is operable to receive a voltage control signal from a voltage control node 614 and, based on the voltage control signal, to generate a positive tank node signal at a positive tank node 616 and a negative tank node signal at a negative tank node 618. According to an embodiment in which the tank circuit 600 is implemented in a voltage controlled oscillator of a frequency synthesizer, the voltage control signal may correspond to a loop filter output signal.

For the illustrated embodiment, a first inductor 604a is coupled to a power supply 620 and to the positive tank node 616, and a second inductor 604b is coupled to the power supply 620 and to the negative tank node 618. In addition, each of a first set of coarse tune capacitors 606a is coupled to the positive tank node 616 and to a coarse tune switch 608, which is operable to couple each coarse tune capacitor 606a to a corresponding coarse tune capacitor 606b in a second set of coarse tune capacitors 606b. Each of the coarse tune capacitors 606b is coupled to the negative tank node 618.

It will be understood that the inductors 604 may provide any suitable amount of inductance and the capacitors 606 and 610 may provide any suitable amount of capacitance without departing from the scope of the present invention.

The coarse tune switches 608 may be controlled by a control system (not shown in FIG. 3) that is operable to measure frequency output and to determine whether to close additional switches 608 to add capacitors 606 in order to lower the frequency or to open additional switches 608 to remove capacitors 606 in order to raise the frequency. Similarly, the gain control switches 612 may be controlled by a control system (not shown in FIG. 3) that is operable to determine whether to close switches 612 to provide tuning bits to the varactor circuit 602 for fine tuning or to open switches 612 to remove tuning bits from the varactor circuit 602. According to one embodiment, the switches 608 and 612 comprise MOS switches.

The varactor circuit 602 comprises a linear voltage controlled capacitance circuit in accordance with one embodiment of the present invention. The varactor circuit 602 may be coupled to the voltage control node 614 through the gain control switches 612 and is coupled to the positive tank node 616 through the fine tune capacitors 610a and to the negative tank node 618 through the fine tune capacitors 610b.

The varactor circuit 602 comprises a plurality of varactor devices, capacitors and resistors. According to the illustrated embodiment, the varactor circuit 602 comprises weighted banks of varactor devices, which provide a gain control mechanism for the tank circuit 600. The varactor devices may comprise MOS varactor devices or any other suitable type of varactor devices.

In operation, a tuning voltage at the voltage control node 614 is applied to the gain control switches 612 and may be provided to the varactor circuit 602 in the form of tuning bits. According to the embodiment in which the tank circuit 600 is implemented in a voltage controlled oscillator of a frequency synthesizer, the tuning voltage may correspond to a loop filter output signal during normal operation. In addition to resistors, each bank of varactor devices in the varactor circuit 602 is also coupled to a bias filter capacitor that is also coupled to ground, which provides a filter for the bank of varactor devices.

When closed, each gain control switch 612 provides a tuning bit to the varactor circuit 602. Thus, because the illustrated embodiment comprises three gain control switches 612, up to three tuning bits may be provided to the varactor circuit 602 for this embodiment. However, as the tank circuit 600 may comprise any suitable number of gain control switches 612, it will be understood that the varactor circuit 602 may receive any suitable number of tuning bits without departing from the scope of the present invention. In addition, the varactor circuit 602 may comprise any suitable number of varactor devices, resistors and capacitors without departing from the scope of the present invention.

The tuning bits may comprise digital control bits that are operable to vary the capacitance-voltage (CV) transfer characteristic of the varactor circuit 602. For example, if each of the tuning bits is in one state, the varactor circuit 602 may provide a minimum gain, while if each of the tuning bits is in the opposite state, the varactor circuit 602 may provide a maximum gain.

The coarse tune switches 608 may be used to provide coarse tuning of the output frequency for the tank circuit 600, and the control voltage may be used to provide fine tuning of the output frequency. Thus, during coarse tuning, the tuning voltage may be set to a mid-range voltage, and the coarse tuning may be performed using the coarse tune switches 608, while also simultaneously adjusting the gain control switches 612. According to one embodiment, the tuning bits comprise the most significant bits of a coarse tuning signal for the tank circuit 600. After coarse tuning, the control voltage connection is then reconnected to the loop filter for fine tuning.

Each varactor device in a particular bank of varactor devices is substantially matched in order to minimize any AC current flowing through the resistors and the capacitors in the varactor bias circuit 602. It will be understood that the resistors in the varactor circuit 602 may provide any suitable amount of resistance and the capacitors in the varactor circuit 602 may provide any suitable amount of capacitance without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A linear voltage controlled capacitance circuit, comprising:
    a plurality of MOS varactor pairs, each MOS varactor pair operable to receive a first tuning voltage, a second tuning voltage, and a bias voltage unique to the MOS varactor pair; and
    the capacitance circuit operable to generate a positive tank node signal and a negative tank node signal based on the first and second tuning voltages and the bias voltages.

2. The circuit of claim 1, the plurality of MOS varactor pairs comprising a first set of MOS varactor pairs, each MOS varactor pair comprising a first varactor device and a second varactor device, each varactor device having a well connection and also having a gate, the gates of the first varactor devices operable to receive a first tuning voltage and the gates of the second varactor devices operable to receive a second tuning voltage.

3. The circuit of claim 2, further comprising:
    a set of first resistors coupled in series, the well connections of the varactor devices in each MOS varactor pair coupled to a corresponding one of the first resistors;
    a second resistor coupled in series with the set of first resistors, the second resistor operable to receive a first bias voltage;
    a positive tank node coupled to the gate of the first varactor device in a specified MOS varactor pair, the positive tank node operable to generate the positive tank node signal; and
    a negative tank node coupled to the gate of the second varactor device in the specified MOS varactor pair, the negative tank node operable to generate the negative tank node signal.

4. The circuit of claim 3, further comprising:
    a set of first capacitors, each of the first capacitors coupled to well connections of the varactor devices in a corresponding MOS varactor pair;
    a second capacitor operable to couple the positive tank node to the gate of the first varactor device in the specified MOS varactor pair; and
    a third capacitor operable to couple the negative tank node to the gate of the second varactor device in the specified MOS varactor pair.

5. The circuit of claim 4, further comprising a second set of MOS varactor pairs, each MOS varactor pair comprising a first varactor device and a second varactor device, each varactor device having a well connection and also having a gate, the gate of each second varactor device coupled to the gate of one of the first varactor devices of the first set of MOS varactor pairs and the gate of each first varactor device coupled to the gate of one of the second varactor devices of the first set of MOS varactor pairs, a well connection of each of the varactor devices of the second set of MOS varactor pairs operable to receive a tuning bit.

6. A linear voltage controlled capacitance circuit, comprising:
    a first set of metal-oxide-semiconductor (MOS) varactor pairs, each MOS varactor pair comprising a first varactor device and a second varactor device, each varactor device having a well connection and also having a gate, the gates of the first varactor devices operable to receive a first tuning voltage and the gates of the second varactor devices operable to receive a second tuning voltage;

a set of first resistors coupled in series, the well connections of the varactor devices in each MOS varactor pair coupled to a corresponding one of the first resistors;

a second resistor coupled in series with the set of first resistors, the second resistor operable to receive a bias voltage;

a positive tank node coupled to the gate of the first varactor device in a specified MOS varactor pair, the positive tank node operable to generate a positive tank node signal; and a negative tank node coupled to the gate of the second varactor device in the specified MOS varactor pair, the negative tank node operable to generate a negative tank node signal.

7. The circuit of claim 6, further comprising a set of first capacitors, each of the first capacitors coupled to the well connections of the varactor devices in a corresponding MOS varactor pair.

8. The circuit of claim 7, further comprising a second capacitor operable to couple the positive tank node to the gate of the first varactor device in the specified MOS varactor pair.

9. The circuit of claim 8, further comprising a third capacitor operable to couple the negative tank node to the gate of the second varactor device in the specified MOS varactor pair.

10. The circuit of claim 6, further comprising a second set of MOS varactor pairs, each MOS varactor pair comprising a first varactor device and a second varactor device, each varactor device having a well connection and also having a gate, the gate of each second varactor device coupled to the gate of one of the first varactor devices of the first set of MOS varactor pairs and the gate of each first varactor device coupled to the gate of one of the second varactor devices of the first set of MOS varactor pairs.

11. The circuit of claim 10, a well connection of each of the varactor devices of the second set of MOS varactor pairs operable to receive a tuning bit.

12. A linear voltage controlled capacitance circuit, comprising:

a first set of metal-oxide-semiconductor (MOS) varactor pairs, each MOS varactor pair comprising a first varactor device and a second varactor device, each varactor device having a well connection and also having a gate;

a first resistor coupled to the gates of the first varactor devices, the first resistor operable to receive a tuning voltage;

a second resistor coupled to the gates of the second varactor devices, the second resistor operable to receive the tuning voltage;

a set of third resistors coupled in series, the well connections of the varactor devices in each MOS varactor pair coupled to a corresponding one of the third resistors;

a fourth resistor coupled in series with the set of third resistors, the fourth resistor operable to receive a bias voltage;

a set of first capacitors, each of the first capacitors coupled to the well connections of the varactor devices in a corresponding MOS varactor pair;

a positive tank node coupled to the gate of the first varactor device in a specified MOS varactor pair, the positive tank node operable to generate a positive tank node signal; and a negative tank node coupled to the gate of the second varactor device in the specified MOS varactor pair, the negative tank node operable to generate a negative tank node signal.

13. The circuit of claim 12, further comprising a second capacitor operable to couple the positive tank node to the gate of the first varactor device in the specified MOS varactor pair.

14. The circuit of claim 13, further comprising a third capacitor operable to couple the negative tank node to the gate of the second varactor device in the specified MOS varactor pair.

15. The circuit of claim 12, further comprising a second set of MOS varactor pairs, each MOS varactor pair comprising a first varactor device and a second varactor device, each varactor device having a well connection and also having a gate, the gate of each second varactor device coupled to the gate of one of the first varactor devices of the first set of MOS varactor pairs and the gate of each first varactor device coupled to the gate of one of the second varactor devices of the first set of MOS varactor pairs.

16. The circuit of claim 15, a well connection of each of the varactor devices of the second set of MOS varactor pairs operable to receive a tuning bit.

17. A tank circuit, comprising:

a first inductor;

a second inductor;

a plurality of first capacitors coupled to the first inductor and in parallel with each other;

a plurality of second capacitors, each of the second capacitors coupled to a corresponding one of the first capacitors;

a plurality of third capacitors coupled to the second inductor and in parallel with each other;

a plurality of fourth capacitors, each of the fourth capacitors coupled to a corresponding one of the third capacitors;

a plurality of MOS switches, each switch coupled between one of the first capacitors and a corresponding second capacitor and between one of the third capacitors and a corresponding fourth capacitor; and a linear voltage controlled capacitance circuit coupled to the first and second inductors and to the plurality of first and third capacitors, the capacitance circuit comprising a plurality of MOS varactor pairs, each MOS varactor pair operable to receive a first tuning voltage, a second tuning voltage, and a bias voltage unique to the MOS varactor pair, the capacitance circuit operable to generate a positive tank node signal and a negative tank node signal based on the first and second tuning voltages and the bias voltages.

18. The circuit of claim 17, the plurality of MOS varactor pairs comprising a first set of MOS varactor pairs, each MOS varactor pair comprising a first varactor device and a second varactor device, each varactor device having a well connection and also having a gate, the gates of the first varactor devices operable to receive a first tuning voltage and the gates of the second varactor devices operable to receive a second tuning voltage, the capacitance circuit further comprising:

a set of first resistors coupled in series, the well connections of the varactor devices in each MOS varactor pair coupled to a corresponding one of the first resistors;

a second resistor coupled in series with the set of first resistors, the second resistor operable to receive a first bias voltage;

a positive tank node coupled to the gate of the first varactor device in a specified MOS varactor pair, the positive tank node operable to generate the positive tank node signal; and a negative tank node coupled to the gate of the second varactor device in the specified MOS varactor pair, the negative tank node operable to generate the negative tank node signal.

19. The circuit of claim 18, the capacitance circuit further comprising:

a set of first capacitors, each of the first capacitors coupled to the well connections of the varactor devices in a corresponding MOS varactor pair;

a second capacitor operable to couple the positive tank node to the gate of the first varactor device in the specified MOS varactor pair; and a third capacitor operable to couple the negative tank node to the gate of the second varactor device in the specified MOS varactor pair.

20. The circuit of claim 19, the capacitance circuit further comprising a second set of MOS varactor pairs, each MOS varactor pair comprising a first varactor device and a second varactor device, each varactor device having a well connection and also having a gate, the gate of each second varactor device coupled to the gate of one of the first varactor devices of the first set of MOS varactor pairs and the gate of each first varactor device coupled to the gate of one of the second varactor devices of the first set of MOS varactor pairs, a well connection of each of the varactor devices of the second set of MOS varactor pairs operable to receive a tuning bit.

21. A tank circuit, comprising:

a first inductor;

a second inductor;

a plurality of first coarse tune capacitors coupled to the first inductor and in parallel with each other;

a plurality of second coarse tune capacitors coupled to the second inductor and in parallel with each other;

a plurality of first fine tune capacitors coupled to the first inductor and in parallel with each other;

a plurality of second fine tune capacitors coupled to the second inductor and in parallel with each other;

a plurality of coarse tune switches, each coarse tune switch coupled between one of the first coarse tune capacitors and a corresponding second coarse tune capacitor; and a linear voltage controlled capacitance circuit coupled to the first inductor through the first fine tune capacitors and coupled to the second inductor through the second fine tune capacitors, the capacitance circuit operable to receive a plurality of tuning bits and the tank circuit operable to generate a positive tank node signal and a negative tank node signal based on the tuning bits.

22. The circuit of claim 21, the capacitance circuit comprising a plurality of banks of varactor devices.

23. The circuit of claim 22, the varactor devices comprising MOS varactor devices.

24. The circuit of claim 21, further comprising a plurality of gain control switches coupled to the capacitance circuit, each gain control switch operable to provide a tuning bit to the capacitance circuit.

* * * * *